US011329150B2

(12) United States Patent
Saxena et al.

(10) Patent No.: US 11,329,150 B2
(45) Date of Patent: May 10, 2022

(54) TERMINATION FOR TRENCH FIELD PLATE POWER MOSFET

(71) Applicant: NXP USA, Inc., Austin, TX (US)

(72) Inventors: Tanuj Saxena, Chandler, AZ (US); Vishnu Khemka, Chandler, AZ (US); Bernhard Grote, Phoenix, AZ (US); Ganming Qin, Chandler, AZ (US); Moaniss Zitouni, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/848,362

(22) Filed: Apr. 14, 2020

(65) Prior Publication Data
US 2021/0320200 A1    Oct. 14, 2021

(51) Int. Cl.
*H01L 29/78* (2006.01)
*H01L 21/265* (2006.01)
*H01L 21/765* (2006.01)
*H01L 29/06* (2006.01)
*H01L 29/10* (2006.01)
*H01L 29/40* (2006.01)
*H01L 29/66* (2006.01)

(52) U.S. Cl.
CPC .... *H01L 29/7811* (2013.01); *H01L 21/26513* (2013.01); *H01L 21/765* (2013.01); *H01L 29/063* (2013.01); *H01L 29/1095* (2013.01); *H01L 29/407* (2013.01); *H01L 29/66734* (2013.01); *H01L 29/7813* (2013.01)

(58) Field of Classification Search
CPC . H01L 29/7811; H01L 29/063; H01L 29/1095
See application file for complete search history.

(56) References Cited

U.S. PATENT DOCUMENTS 6,037,632 A * 3/2000 Omura ............ H01L 21/74
257/139
7,804,150 B2 * 9/2010 Jeon ............ H01L 29/0634
257/492

(Continued)

OTHER PUBLICATIONS

EPO extended search report Application 21167789.3 dated Sep. 22, 2021 (Year: 2021).*

(Continued)

*Primary Examiner* — Vincent Wall

(57) ABSTRACT

A semiconductor device includes a substrate having opposed first and second major surface, an active area, and a termination area. Insulated trenches extend from the first major surface toward the second major surface, each of the insulated trenches including a conductive field plate and a gate electrode overlying the conductive field plate, the gate electrode being separated from the field plate by a gate-field plate insulator. The field plate extends longitudinally in both of the active and termination areas and the gate electrode is absent in the termination area. A body region of a first conductivity type extends laterally between pairs of the insulated trenches. First and second spacer regions of a second conductivity type extend laterally between the pairs of the insulated trenches at the termination area to produce segments of the first conductivity type between the first and second spacer regions that are isolated from the body region.

18 Claims, 10 Drawing Sheets

(56) References Cited

U.S. PATENT DOCUMENTS

| | | | |
|---|---|---|---|
| 8,860,171 B2* | 10/2014 | Kitagawa | H01L 29/41 257/492 |
| 9,299,776 B2 | 3/2016 | Grivna et al. | |
| 9,373,700 B2* | 6/2016 | Hirler | H01L 29/861 |
| 10,103,257 B1 | 10/2018 | Qin et al. | |
| 10,431,678 B2 | 10/2019 | Qin et al. | |
| 2002/0027237 A1* | 3/2002 | Onishi | H01L 29/0634 257/262 |
| 2004/0135228 A1* | 7/2004 | Iwamoto | H01L 29/7813 257/510 |
| 2005/0017293 A1* | 1/2005 | Zundel | H01L 29/7811 257/329 |
| 2005/0167742 A1 | 8/2005 | Challa et al. | |
| 2009/0179260 A1* | 7/2009 | Kobayashi | H01L 29/0869 257/330 |
| 2010/0032791 A1* | 2/2010 | Hozumi | H01L 29/0634 257/493 |
| 2010/0140689 A1 | 6/2010 | Yedinak et al. | |
| 2012/0178228 A1* | 7/2012 | Koon | H01L 29/7828 438/238 |
| 2018/0315812 A1 | 11/2018 | Yedinak et al. | |
| 2019/0081173 A1 | 3/2019 | Nishiwaki et al. | |

OTHER PUBLICATIONS

Kao, Y.C et al.; "High-Voltage Planar p-n Junctions"; Proceedings of the IEEE, vol. 55, No. 8; 6 pages (Aug. 1967).

* cited by examiner

PRIOR ART

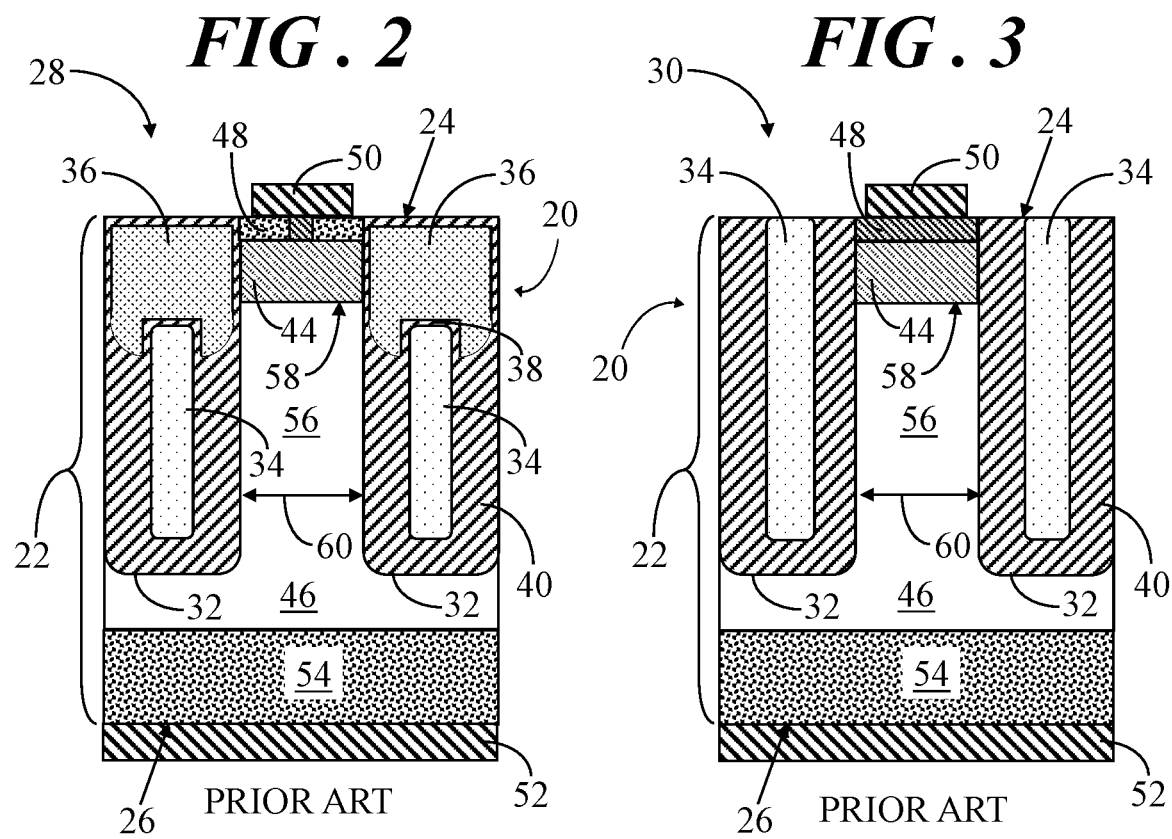
FIG. 2 PRIOR ART
FIG. 3 PRIOR ART
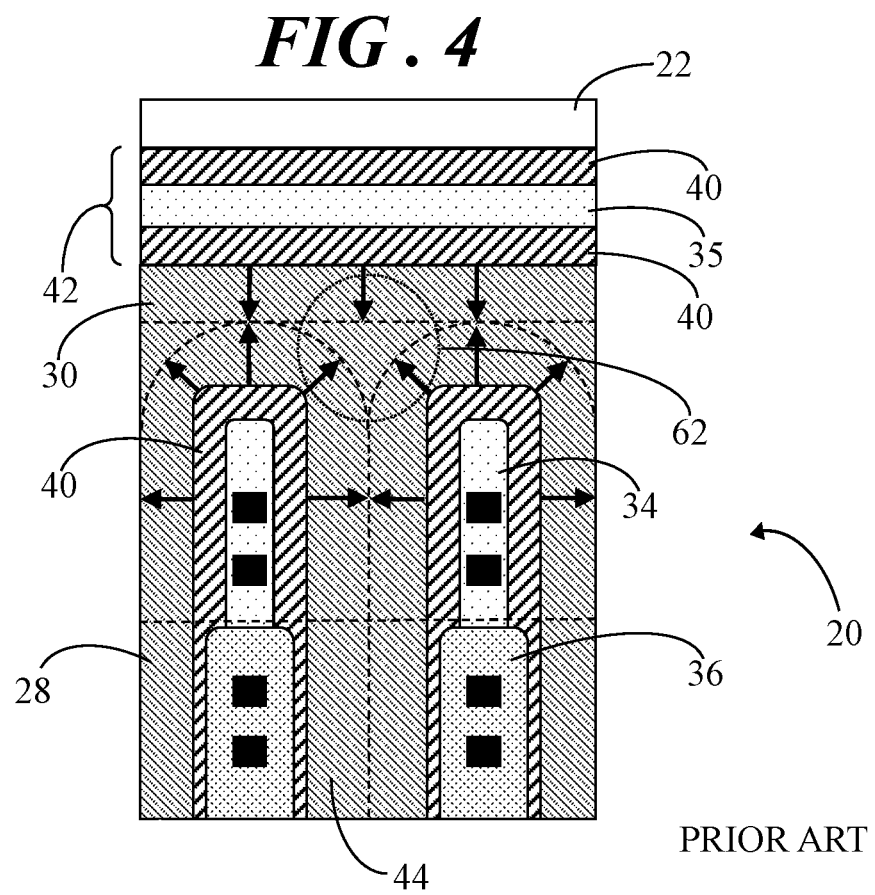
FIG. 4 PRIOR ART

TERMINATION FOR TRENCH FIELD PLATE POWER MOSFET

TECHNICAL FIELD OF THE INVENTION

The present invention relates generally to power MOSFETs. More specifically, the present invention relates to a semiconductor device design of a power MOSFET for improving breakdown voltage characteristics.

BACKGROUND OF THE INVENTION

Vertical Field Effect Transistors (FETs) are suitable for high voltage applications due to their relatively high breakdown voltage, compared to FETs with shorter conduction channels. A trench field plate power Metal Oxide Semiconductor FET (MOSFET) is a type of vertical FET that typically employs reduced surface field (RESURF) action under the influence of field plates (shield electrodes) inside gate trenches. RESURF can achieve a lower on resistance ($R_{DS(on)}$) while still maintaining a high breakdown voltage (BV). While the RESURF action can enable improvements in the BV-$R_{DS(on)}$ tradeoff, the sensitivity to variations in doping and/or dimensions is greatly increased. Further, the termination structures of trench field plate power MOSFET devices are especially significant since an improperly designed termination can cause the breakdown voltage to be low, thus forcing the MOSFET device to be under-designed so that the optimal BV-$R_{DS(on)}$ tradeoff cannot be achieved.

SUMMARY

Aspects of the disclosure are defined in the accompanying claims.

In a first aspect, there is provided a semiconductor device comprising a substrate having opposed first and second major surfaces, an active area, and a termination area; insulated trenches extending from the first major surface toward the second major surface, each of the insulated trenches including a conductive field plate and a gate electrode overlying the conductive field plate, the gate electrode being separated from the field plate by a gate-field plate insulator, wherein the conductive field plate extends longitudinally in both of the active and termination areas and the gate electrode is absent in the termination area; a body region of a first conductivity type extending laterally between pairs of the insulated trenches; and first and second spacer regions of a second conductivity type extending laterally between the pairs of the insulated trenches at the termination area to produce segments of the first conductivity type between the first and second spacer regions that are isolated from the body region.

In a second aspect, there is provided a method for fabricating a semiconductor device comprising forming a drain region with a doped semiconductor substrate; growing an epitaxial layer on the drain region such that an exterior surface of the epitaxial layer defines a first major surface of the semiconductor device and a second major surface of the semiconductor device opposes the first major surface; forming insulated trenches in the epitaxial layer, each of the insulated trenches being disposed in parallel with one another and extending from the first major surface toward the second major surface; forming a conductive field plate in each of the insulated trenches separated from the epitaxial layer by an insulator; forming a gate electrode over the conductive field plate in each of the insulated trenches, the gate electrode being separated from the field plate by a gate-field plate insulator, wherein the semiconductor device has an active area and a termination area surrounding the active area, the gate electrode is absent in the termination area, and the conductive field plate extends longitudinally in both of the active and termination areas; forming a body region of a first conductivity type extending laterally between pairs of the insulated trenches; and producing segments of the first conductivity type at the termination area, the segments being produced between first and second spacer regions of a second conductivity type extending laterally between the pairs of the insulated trenches, the segments being isolated from the body region.

In a third aspect, there is provided a semiconductor device comprising a substrate having opposed first and second major surfaces, an active area, and a termination area surrounding the active area; insulated trenches extending from the first major surface toward the second major surface, each of the insulated trenches comprises first and second end portions and an middle portion extending longitudinally between the first and second end portions, each of the insulated trenches including a conductive field plate and a gate electrode overlying the conductive field plate, the gate electrode being separated from the field plate by a gate-field plate insulator, wherein the conductive field plate extends longitudinally in both of the active and termination areas and the gate electrode is absent in the termination area; a body region of a first conductivity type extending laterally between pairs of the insulated trenches; first and second spacer regions of a second conductivity type extending laterally between the pairs of the insulated trenches at the first end portion to produce first segments of the first conductivity type between the first and second spacer regions that are isolated from the body region; and third and fourth spacer regions of the second conductivity type extending laterally between the pairs of the insulated trenches at the second portion to produce additional segments of the first conductivity type between the third and fourth spacer regions that are isolated from the body region, wherein the body region, the first segments, and the additional segments are configured to be formed concurrently in the same implantation process.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 2 shows a cross-sectional view of the prior art trench power MOSFET taken along section line 2-2 of FIG. 1;

FIG. 3 shows a cross-sectional view of the prior art trench power MOSFET taken along section line 3-3 of FIG. 1;

FIG. 4 shows a partial plan view of the prior art trench power MOSFET;

DETAILED DESCRIPTION

In overview, the present disclosure concerns a semiconductor device with improved breakdown voltage characteristics and methodology for fabricating such a semiconductor device. In particular, embodiments entail a trench field plate power Metal Oxide Semiconductor Field Effect Transistor (MOSFET) having a set of floating body segments formed between device trenches of the MOSFET. The floating body segments break up or otherwise isolate an active body area of the semiconductor device from a termination area of the semiconductor device. Further, the floating body segments are able to self-bias to an appropriate positive voltage. Accordingly, an electric field at a triple point region of the termination area can be effectively suppressed so that breakdown voltage roll-off at the termination area can be avoided. In some embodiments, the floating body segments may be formed using the same body implant/diffusion process as the active body area of the device. Such an approach can circumvent the need for additional masks/process steps to create the floating body segments and thereby achieve enhancements in fabrication efficiency and cost savings.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements. These different elements may be produced utilizing current and upcoming microfabrication techniques. Accordingly, although different shading and/or hatching is utilized in the illustrations, the different elements within the structural layers may be formed out of the same material.

Figure 1:
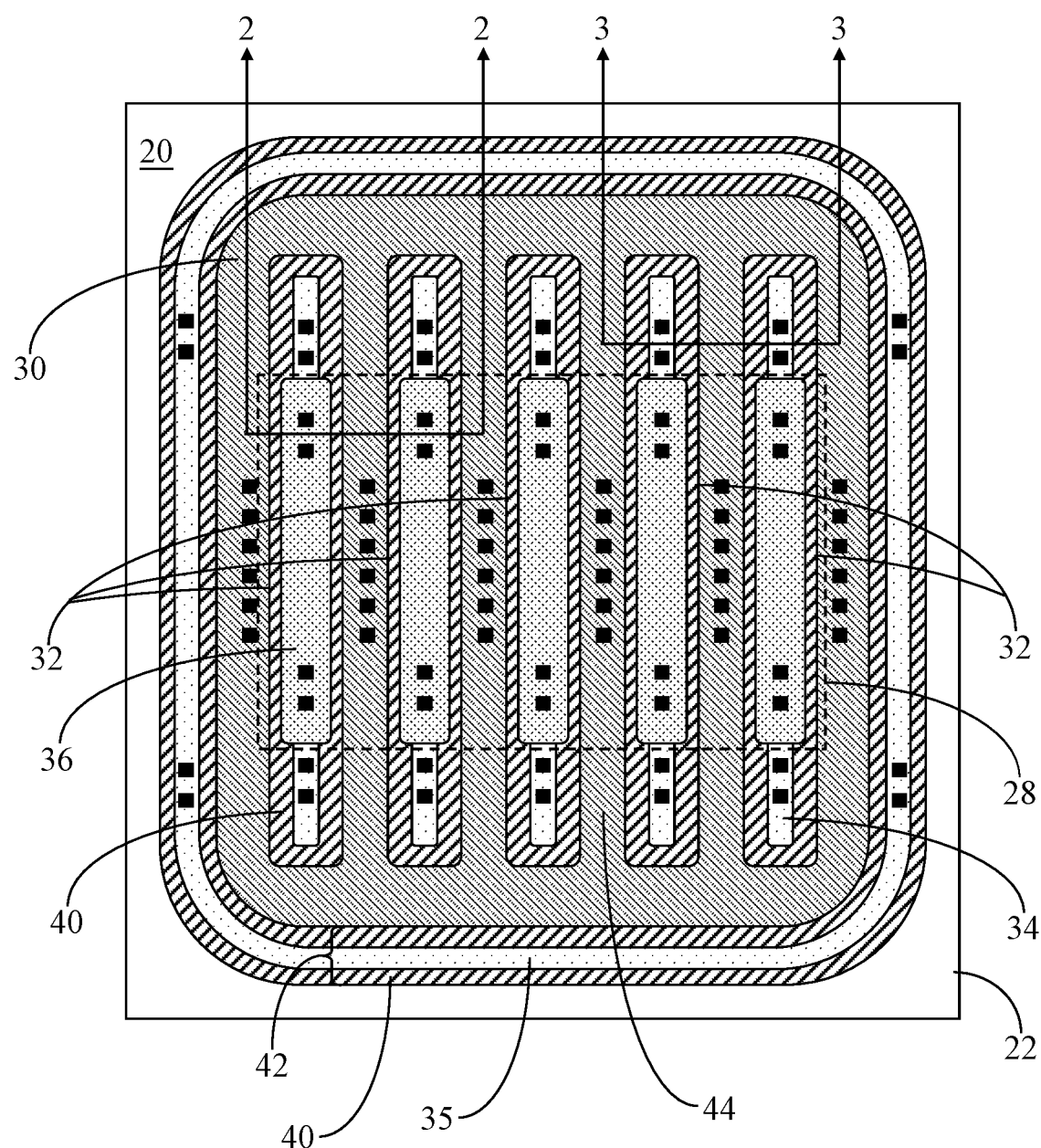
FIG. 1 shows a plan view of a prior art trench power MOSFET.

Referring to FIGS. 1-3, FIG. 1 shows a plan view of a prior art trench power MOSFET 20, FIG. 2 shows a cross-sectional view of prior art trench power MOSFET 20 taken along section line 2-2 of FIG. 1, and FIG. 3 shows a cross-sectional view of prior art trench power MOSFET 20 taken along section line 3-3 of FIG. 1. In this prior art example, MOSFET 20 includes a substrate 22 having opposed first and second major surfaces 24, 26, an active area 28 (e.g., generally denoted by a dashed line box), and a termination area 30 surrounding active area 28 (e.g., the area outside of the dashed line box).

Parallel insulated trenches 32 extend from first major surface 24 toward second major surface 26. Each of trenches 32 includes a conductive field plate 34 (e.g., a first polysilicon layer) and a gate electrode 36 (e.g., a second polysilicon layer) overlying the shield plate 34, with gate electrode 36 being separated from field plate 34 by a gate-field plate insulator 38 (see FIG. 2). Field plate 34, which may alternatively be referred to herein as shield plate 34, extends longitudinally in each of trenches 32 in both of active and termination areas 28, 30. Whereas, gate electrode 36 extends longitudinally in each of trenches 32 in active area 28, but is absent from trenches 32 in termination area 30. Thus, the cross-sectional view of FIG. 2 shows trenches 32 in active area 28 lined with an insulator 40 (e.g., shield oxide), and with both shield plate 34 and gate electrode 36 separated by gate-field plate insulator 38. Conversely, the cross-sectional view of FIG. 3 shows show trenches 32 in termination area 30 lined with insulator 40, but with only shield plate 34.

An insulated termination trench loop 42 surrounds termination area 30. Termination trench loop 42 is also lined with insulator 40 and a shield plate 35 (e.g., the first polysilicon layer) also resides in insulated termination trench loop 42. Although both shield plates 34, 35 and gate electrodes 36 may be formed of the same polysilicon material, shield plates 34, 35 are illustrated with a light stippled pattern and gate electrodes 36 are illustrated with a darker stippled pattern to distinguish one from the other.

In the prior art trench power MOSFET 20, a continuous body region 44 is formed in both active and termination areas 28, 30 above an epitaxial layer 46 of substrate 22. Body region 44 extends in the silicon mesas between trenches 32, and a source implant region 48 may be formed overlying body region 44 between the pairs of trenches 32 in active area 28. Source contacts 50 may be formed on first major surface 24 of substrate 22 overlying source implant region 48 and a drain contact 52 may be formed on second major surface 26 of substrate 22 underlying a drain region 54 of substrate 22. For clarity, source implant region 48 and source contacts 50 are not shown in FIG. 1 so that continuous body region 44 may be more readily visualized. However, source implant region 48 and source contacts 50 are presented in FIGS. 2-3, with source contacts 50 positioned between pairs of trenches 32.

In the example of FIGS. 1-3, drain region 54 may be an N++ doped substrate and insulated trenches 32 (with shield plates 34 and gate electrodes 36 formed therein) are etched into an N-epitaxial layer 46. N-epitaxial layer 46 between pairs of insulated trenches 32 is also a lightly doped N-drift region 56 of MOSFET 20, with body region 44 being formed of a P-type dopant (e.g., PHV) formed for a MOSFET channel, and gate electrodes 36 being formed between shield plates 34 and first major surface 24. In this n-channel example, under reverse bias, a depletion region in drift region 56 (e.g., the epitaxial layer 46 between pairs of trenches 32) grows under the influence of both a PN junction 58 (e.g., the junction between body region 44 and epitaxial layer 46) and shield plates 34.

Breakdown takes place at the bottom of drift region 56 in over-depletion situations where the charge in the silicon pillar between pairs of trenches 32 is low (e.g., narrow silicon pillar, low doping, thin insulator 40). Breakdown takes place at the top of drift region 56 in under-depletion situations where the charge in the silicon pillar between pairs of trenches 32 is high (e.g., wide silicon pillar, high doping). As long as the breakdown occurs at the bottom of the drift region, the breakdown voltage (BV) increases with an increasing width 60 between trenches 32. At a sufficiently high width 60, the electric field at the top of drift region 56 increases and the breakdown voltage drops.

In the typical layout of trench MOSFET 20, active area 28 of MOSFET 20 experiences generally two-dimensional reduced surface field (RESURF) action and the charge balance may be readily optimized. However, termination area 30 may have regions which experience a different RESURF action than active area 28, and may therefore have a different breakdown voltage (BV). That is, the conventional layout of MOSFET 20 that includes termination trench loop 42 enclosing all of trenches 32 experiences a generally three-dimensional RESURF.

FIG. 4 shows a partial plan view of the prior art trench power MOSFET 20. At termination area 30, triple-point regions 62 (one shown) are formed. Triple-point regions 62 are approximately triangular locations defined by intersections of the depletion fronts extending into the silicon pillars from insulated trenches 32. In this example, shield plate 34 is located in each of the pair of trenches 32 as well in the surrounding termination trench loop 42. Depletion of drift region 56 (FIG. 3) in MOSFET 20 grows under the influence of shield plates 34. At termination area 30 there is an asymmetric growth of the depletion region at triple-point regions 62 because the "triple point" effectively acts as a wider region than width 60 between pairs of insulated trenches 32. That is, triple-point regions 62 can become too wide to suppress the electric field at the top of the drift region at the location in triple-point regions 62 thereby causing the RESURF action to degrade which, in turn, can lead to a reduction in the breakdown voltage of MOSFET 20. Accordingly, the breakdown voltage of the prior art trench MOSFET 20 is limited by triple-point regions 62 in termination area 30 instead of by the pairs of trenches 32 in active area 28.

The electric field at the top of the drift region at the triple-point regions 62 may be suppressed if body region 44 at triple-point regions 62 is biased to a sufficiently positive voltage. However, continuous body region 44 in prior art trench MOSFET 20 is connected throughout both active and termination areas 28, 30 through the PHV implant/diffusion region. Accordingly, embodiments disclosed herein implement a set of floating body segments, formed between device trenches, which break up the continuous body region of a trench MOSFET. Further, the floating body segments can self-bias to an appropriate positive voltage to obtain a positive bias on the triple-point regions. As such, the electric field in the triple-point region can be effectively suppressed and a breakdown voltage reduction at the triple-point region can be avoided.

Figure 5:
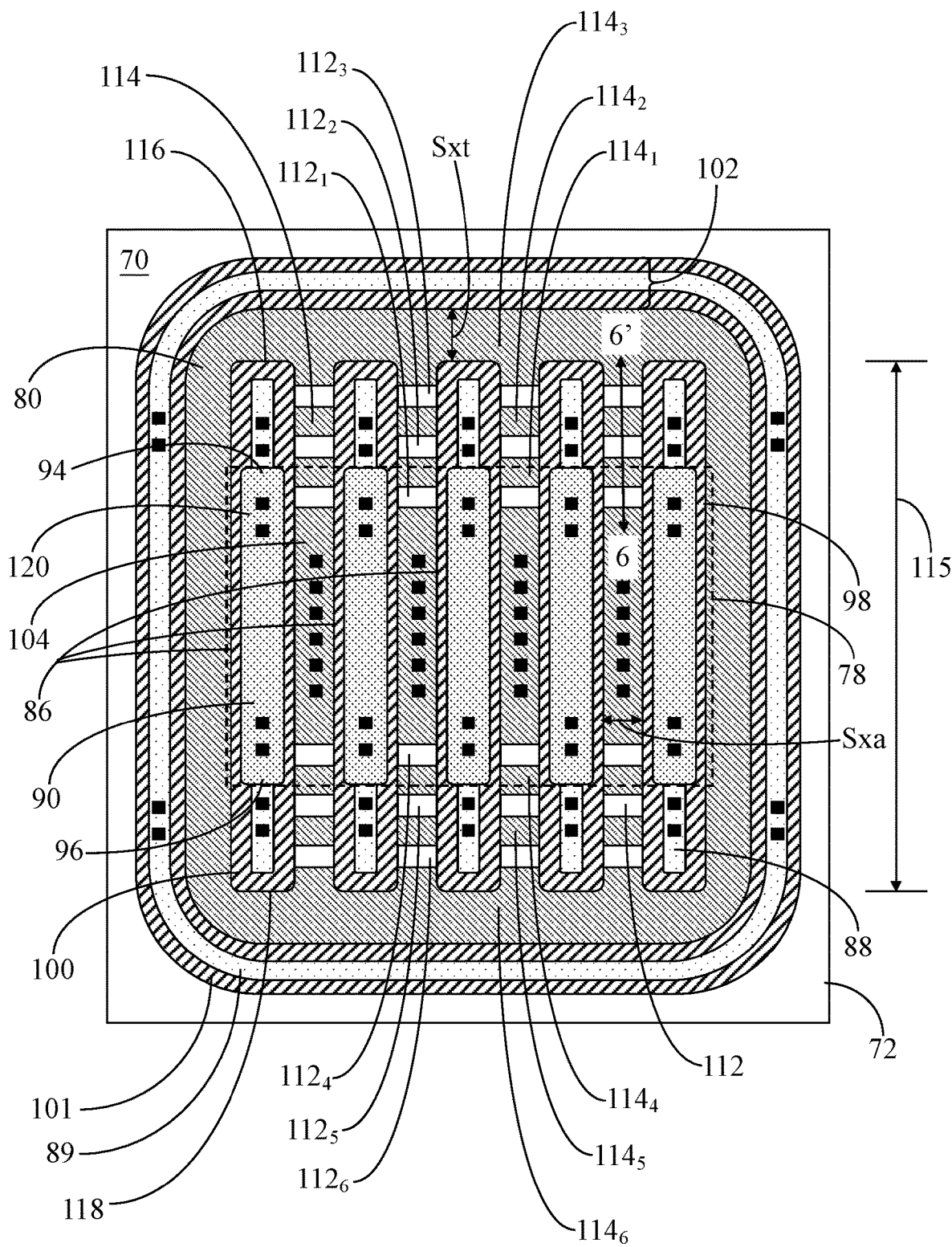
FIG. 5 shows a plan view of a trench power MOSFET in accordance with an embodiment.
Figure 6:
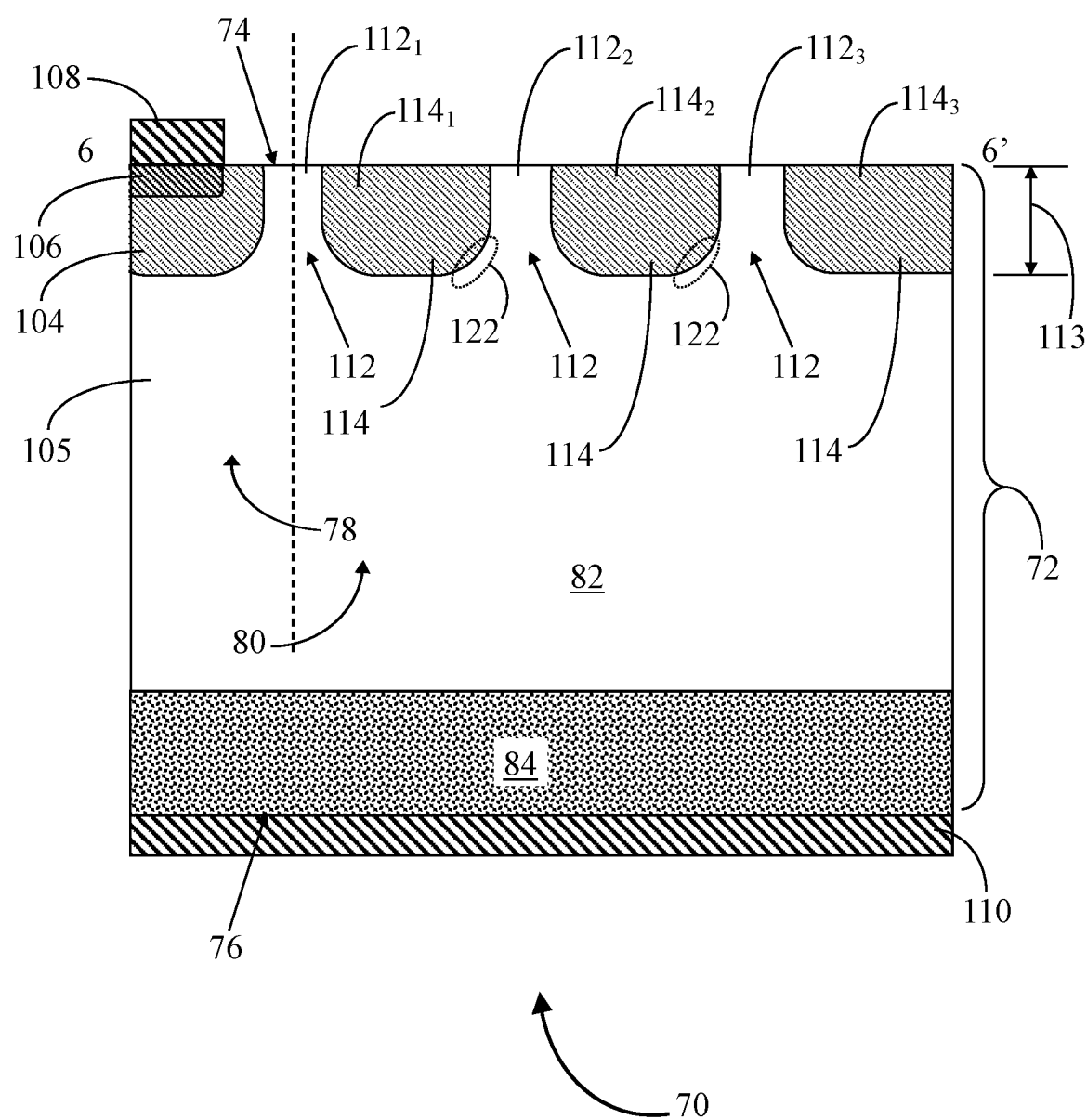
FIG. 6 shows a cross-sectional view of the trench power MOSFET taken along section line 6-6' of FIG. 5.

Referring to FIGS. 5 and 6, FIG. 5 shows a plan view of a semiconductor device 70 in accordance with an embodiment and FIG. 6 shows a cross-sectional view of semiconductor device 70 taken along section line 6-6' of FIG. 5. Semiconductor device 70 may be, or may otherwise include, a trench field plate power MOSFET. As such, semiconductor device 70 may alternatively be referred to herein as MOSFET 70 or trench power MOSFET 70. MOSFET 70 includes a semiconductor substrate 72 having opposed first and second major surfaces 74, 76 (see FIG. 6), an active area 78, and a termination area 80 surrounding active area 78. In FIG. 5, active area 78 is generally surrounded by a dashed line box. In FIG. 6, a dashed line delineates active area 78 from termination area 80. For clarity of exposition, the following embodiments are based on an N-channel FET (NFET). However, the teachings are also applicable to embodiments based on a P-channel FET (PFET), where the doping polarities of the PFET are reversed from the NFET.

Semiconductor substrate 72 may include a number of epitaxial layers 82 supported by an original substrate 84. In this example, semiconductor substrate 72 includes a single n-type epitaxial layer 82, and original substrate 84 may be an n-type heavily or moderately doped substrate. Original substrate 84 may function as a drain region, and hence may alternatively be referred to herein as drain region 84. Epitaxial layer 82 and drain region 84 are not necessarily drawn to scale in FIG. 6. For example, in some cases drain region 84 may be thinned from an initial thickness after growth of epitaxial layer(s) 82 and other fabrication procedures. The structural, material, and other characteristics of semiconductor substrate 72 may vary from the example shown. For example, additional, fewer, or alternative layers may be included in semiconductor substrate 72.

MOSFET 70 further includes parallel insulated trenches 86 extending from first major surface 74 toward second major surface 76 in semiconductor substrate 72. Each of trenches 86 includes a conductive field plate 88 (e.g., a first polysilicon layer) and a gate electrode 90 (e.g., a second polysilicon layer) overlying the conductive field plate 88, with gate electrode 90 being separated from conductive field plate 88 by a gate-field insulator (not visible, but corresponding to gate-field insulator plate 38 shown in FIG. 2). Conductive field plate 88, which may alternatively be referred to herein as shield plate 88, extends longitudinally in each of trenches 86 in both of active and termination areas 78, 80. In some embodiments, distal ends 94, 96 of gate electrode 90 in each of insulated trenches 86 define an outer perimeter 98 of active area 78. As such, gate electrode 90 extends longitudinally in each of trenches 86 to outer perimeter 98 of active area 78 (defined by distal ends 94, 96) of gate electrode 90, but is absent from trenches 86 in termination area 80. Thus, trenches 86 in active area 78 are lined with an insulator 100 (e.g., shield oxide), with gate electrode 90 separated from conductive field plate 88 by the gate-field insulator. Conversely, trenches 86 in termination area 80 are lined with insulator 101 (which may be the same material as the insulator 100), but only include conductive field plate 89, alternatively referred to as a shield plate 89 herein. Only a few trenches 86 are shown herein for simplicity. However, it should be understood that MOSFET 70 may have more or less than the quantity of trenches 86 shown.

An insulated termination trench loop 102 surrounds termination area 80. Termination trench loop 102 is also lined with an insulator 101 (which may be the same material as the insulator 100) and includes a conductive field plate 89 (e.g., the first polysilicon layer) that also resides in insulated termination trench loop 102. Again, although both conductive field plates 88, 89 and gate electrodes 90 may be formed of the same polysilicon material, conductive field plates 88, 89 are illustrated with a light stippled pattern and gate electrodes 90 are illustrated with a darker stippled pattern to distinguish one from the other.

A body region 104 extends laterally between pairs of insulated trenches 86 above epitaxial layer 82 of semiconductor substrate 72. Body region 104 extends into the silicon mesas between trenches 86. A drift region 105 is located under body region 104 between trenches 86 and a source implant region 106 (shown in the cross-sectional view of FIG. 6) may be formed overlying body region 104 between the pairs of trenches 86 in active area 78. Thus, source region 106, body region 104, drift region 105, and drain region 84 extend in that order from first major surface 74 toward second major surface 76. Source contacts 108 may be formed on first major surface 74 of substrate 72 overlying source implant region 106 and a drain contact 110 may be formed on second major surface 76 of substrate 72 underlying drain region 84 of substrate 22. For clarity, source implant region 106 and source contacts 108 are not shown in FIG. 5 so that body region 104 may be more readily visualized. A channel is formed in each section of body region 104 between insulated trenches 86 during operation for conduction of charge carriers between source contacts 108 and drain contact 110.

As shown in FIG. 5, body region 104 is generally present in active area 78 and in termination area 80, extending to insulated trench loop 102. However, spacer regions 112 extend laterally between pairs of insulated trenches 86 at termination area 80 to produce segments 114 between spacer regions 112 that are isolated from body region 104. The phrase "at termination area 80" is meant to encompass spacer regions 112 and/or segments 114 that are located outside of outer perimeter 98 of active area 78 and are thus in termination area 80, to encompass spacer regions 112 and/or segments 114 that are located inside of outer perimeter 98 and are thus in active area 78 but near distal ends 94, 96 and adjacent to gate electrodes 90 (but separated from gate electrodes 90 by insulator 100), and to encompass spacer regions 112 and/or segments 114 that span across outer perimeter 98.

Body region 104 is of a first conductivity type and epitaxial layer 82 is of a second conductivity type. In this n-channel example, body region 104 is a p-type doped region, and more particularly, a high voltage P-region (PHV), and as mentioned previously, epitaxial layer 82 is an n-type doped region. In accordance with an embodiment, spacer regions 112 are of the second conductivity type, e.g., n-type doped regions, and segments 114 are of the first conductivity type, e.g., p-type doped regions. In some embodiments, segments 114 may be formed using the same body implant/diffusion process as the active body area (e.g., body region 104) of MOSFET 70 in order to circumvent the need for additional masks/process steps to create the segments 114. As such, body region 104 and segments 114 may extend the same depth 113 (FIG. 6) into substrate 72.

Segments 114 extend laterally between pairs of trenches 86 (e.g., perpendicular to a longitudinal dimension 115 of trenches 86) and laterally between spacer regions 112 (e.g., parallel to longitudinal dimension 115 of trenches 86). Further, these segments 114 are isolated from body region 104 and from one another. As particularly shown in FIG. 6, p-type segments 114 are separated from body region 104 and from one another by n-type spacer regions 112 (e.g., the portion of epitaxial layer 82 between segments 114). Accordingly, segments 114 are not connected to one another or to body region 104 via a direct contact or through a region of similar doping type. Since segments 114 have the same doping type as body region 104, they may be formed using the same body implant/diffusion process as the active body area, and they are not connected to one another or to body region 104, segments 114 may be referred to herein as floating body segments 114.

Each of insulated trenches 86 includes first and second end portions 116, 118 and a middle portion 120 extending longitudinally between first and second end portions 116, 118. In this example configuration, spacer regions 112 extending between the pairs of insulated trenches 86 at first ends 116 include spacer regions $112_1$, $112_2$, and $112_3$. Spacer region $112_1$ is adjacent to body region 104. Floating body segments $114_1$ reside between spacer regions $112_1$ and $112_2$. Further, floating body segments $114_2$ reside between spacer regions $112_2$ and $112_3$. Still further, a floating body segment $114_3$ resides between spacer region $112_3$ and insulated trench loop 102. Similarly, spacer regions 112 extending between the pairs of insulated trenches 86 at second ends 118 include spacer regions $112_4$, $112_5$, and $112_6$. Spacer region $112_4$ is adjacent to body region 104. Floating body segments $114_4$ reside between spacer regions $112_4$ and $112_5$. Further, floating body segments $114_5$ reside between spacer regions $112_5$ and $112_6$. Still further, a floating body segment $114_6$ resides between spacer region $112_6$ and insulated trench loop 102. In the illustrated configurations, floating body segments $114_3$ and $114_6$ form a continuous structure with one another. However, in other embodiments, they may be discontinuous structures so that floating body segment $114_3$ is isolated from floating body segment $114_6$.

Floating body segments 114 introduced between pairs of insulated trenches 86 effectively disconnect termination area 80 from active area 78. Accordingly, when a bias is applied on drain region 84 with respect to body region 104, epitaxial layer 82 starts getting depleted. As the depletion region expands, the depletion region may eventually touch, for example, floating body segment $114_1$. At that point, floating body segment $114_1$ acquires the potential "touching" it. Subsequently, the depletion region starts to expand from floating body segment $114_1$ and reaches floating body segment $114_2$. At that point, floating body segment $114_2$ acquires the potential "touching" it. Finally, in this example, the depletion region starts to expand from floating body segment $114_2$ and reaches floating body segment $114_3$, and at that point, floating body segment $114_3$ acquires the potential "touching" it. Although floating body segments $114_1$, $114_2$, and $114_3$ are mentioned herein with this explanation, the equivalent behavior occurs at $114_4$, $114_5$, and $114_6$. Accordingly, the depletion region expands when drain region 84 is biased appropriately which in turn causes floating body segments 114 to pick up positive potential.

There may be a slight enhancement of the electrical field at curvature regions 122 (see FIG. 6) of floating body segments 114 due to the curvature of the PN junction (e.g., junction between n-type epitaxial layer 82 and p-type floating body segments 114). However, in the configuration of multiple floating body segments 114, curvature regions 122 may be effectively shielded by the adjacent floating body segments 114. Accordingly, the enhancement of the electrical field at curvature regions can be controlled.

The example of FIG. 5 includes spacer regions $112_1$ and $112_4$ adjacent to gate electrodes 90 in trenches 86, separated by insulator 100. Further, at least portions of floating body segments $114_1$ and $114_4$ are adjacent to gate electrodes 90 in trenches 86. Positioning floating body segments $114_1$ and $114_4$ adjacent to gate electrodes 90 may mitigate the effect of the electrical field enhancement at curvature regions 122. That is, the electric field at the curvature regions 122 in this scenario may be lower as compared to the electric field at curvature regions when floating body segments 114 are in termination area 80 next to conductive field plate 88. However, since gate electrodes 90 are physically closer to the silicon epitaxial layer 82, relative to conductive field plates 88, the depletion region may spread out quickly such that the depletion region may reach the next segment 114 at relatively low voltage on the drain.

Accordingly, some embodiments (such as the one shown) may utilize a combination of segments 114 adjacent to gate electrodes 90 (separated by insulator 100) in active area 78 and segments 114 adjacent to conductive field plates 88,89 (separated by insulator 100 and/or 101) in termination area 80. In such a configuration, the first segments 114 may be more susceptible to the electric field enhancement at curvature regions 122, so that their placement adjacent to gate electrodes 90 may effectively suppress the electric field at curvature regions 122. The later segments 114 adjacent to conductive field plates 88 and also 89 may have a higher voltage drop for the same distance and may therefore be utilized to obtain the desired voltage.

In the configuration of FIGS. 5-6, simulations reveal that the breakdown voltage at termination area 80 experiences an increase followed by a decrease. However, there is a wide range of the Sxt (e.g., the distance between the end of one of trenches 86 and insulated trench loop 102) where the breakdown voltage remains almost constant for a combination of Sxa (e.g., the distance between trenches 86) and a given doping of epitaxial layer 82. Accordingly, there may be insignificant impact ionization in the triple-point regions such that the impact ionization effectively moves into active area 78. Therefore, the breakdown voltage is not limited by either Sxt (e.g., the distance between the end of one of trenches 86 and insulated trench loop 102) or the triple-point region (e.g., triple-point regions 62 shown in FIG. 4).

Figure 7:
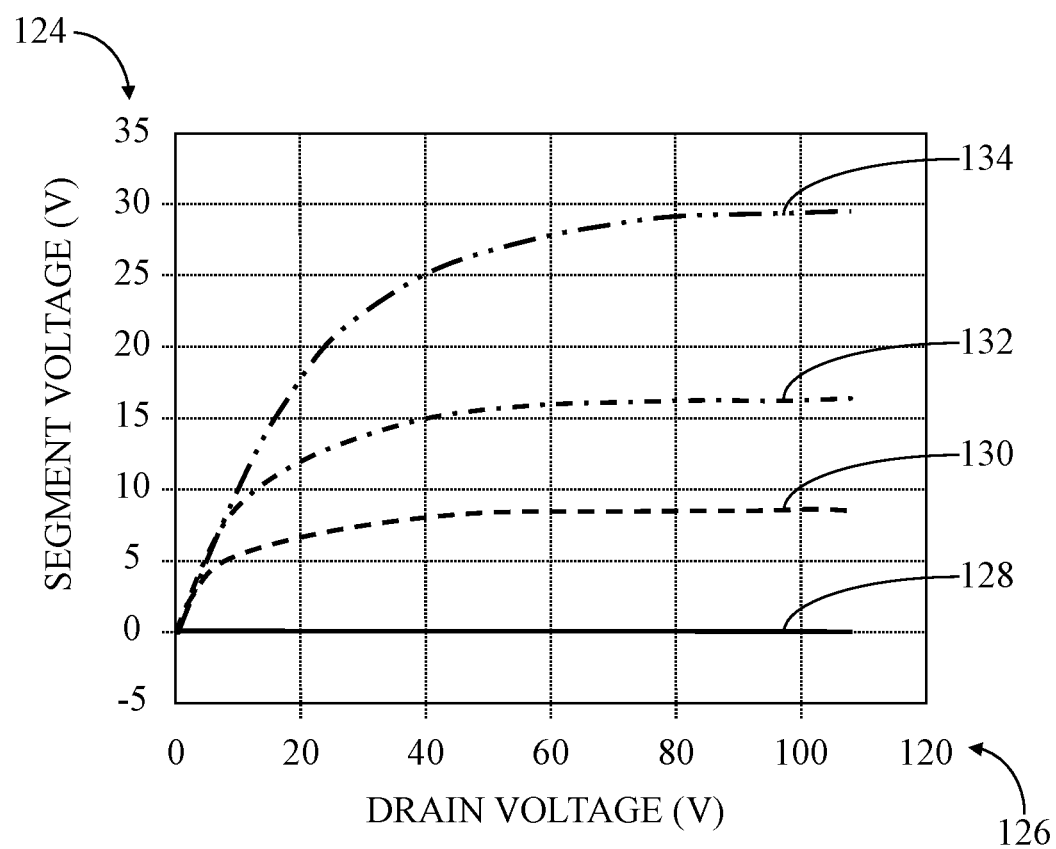
FIG. 7 shows a graphical view of simulation results for segment voltage as a function of drain voltage for the trench power MOSFET of FIG. 5.

FIG. 7 shows a graphical view of simulation results for a segment voltage 124 as a function of drain voltage 126 for trench power MOSFET 70 (FIGS. 5-6). A solid line trace 128 represents a main source voltage. A dashed line trace 130 represents segment voltage 124 at floating body segment 114$_1$ as a function of drain voltage 126. A dash-dot line trace 132 represents segment voltage 124 at floating body segment 114$_2$ as a function of drain voltage 126. And, a dash-dot-dot trace 134 represents segment voltage 124 at floating body segment 114$_3$ as a function of drain voltage 126. Although the following discussion is directed to floating body segments 114$_1$, 114$_2$, and 114$_3$, it should be understood that this discussion applies equivalently to floating body segments 114$_4$, 114$_5$, and 114$_6$.

As a drain voltage 126 increases, floating body segments 114 pick up potential. In this example, the triple-point body region (e.g., floating body segment 114$_3$) acquires a voltage potential of approximately thirty volts. The thirty volt potential may be sufficient to suppress the electric field in the triple-point region (e.g., triple-point regions 62 shown in FIG. 4) and move the impact ionization to active area 78. FIG. 7 is provided to show that a reasonable positive potential (e.g., thirty volts) may be acquired by the termination body (e.g., termination area 30). The thirty voltage potential may be sufficient to suppress the electric field in triple-point regions 62 in the case under consideration. However, in general, the minimum voltage needed to achieve such an effect can vary between different designs, and is dependent upon the values of Sxa, Sxt, doping, trench oxide thickness, and so forth.

In the prior art design of FIGS. 1-3, the breakdown voltage falls off rapidly beyond a critical value of Sxt. In comparison, the floating body segment design of FIGS. 5-6 extends the rising phase and converts it into a plateau. Thus, the optimum breakdown voltage values for the floating body segment design are higher than the breakdown voltage values of prior art design so that the breakdown voltage values are limited by the device core (e.g., active area 78) even for high pillar charge (e.g., high doping, wider Sx) scenarios. In other words, utilization of a floating body segment at the termination area may suppress the electric field in the triple-point regions to avoid the breakdown voltage roll off at wider values of Sxt. The breakdown voltage can, therefore, be made higher and may be limited by the active area even for high epitaxial layer doping and wide values of Sx (Sxa and Sxt), thus achieving a better breakdown voltage-lower on resistance (BV-R$_{DS(on)}$) tradeoff. Further, the floating body segment design can be extended by employing a larger number of floating body segments along with larger spacing to attain a higher potential at the triple-point regions, if needed. Thus, the floating body segment design may allow a wide design and process margin (e.g., doping and/or dimensions).

Figure 8:
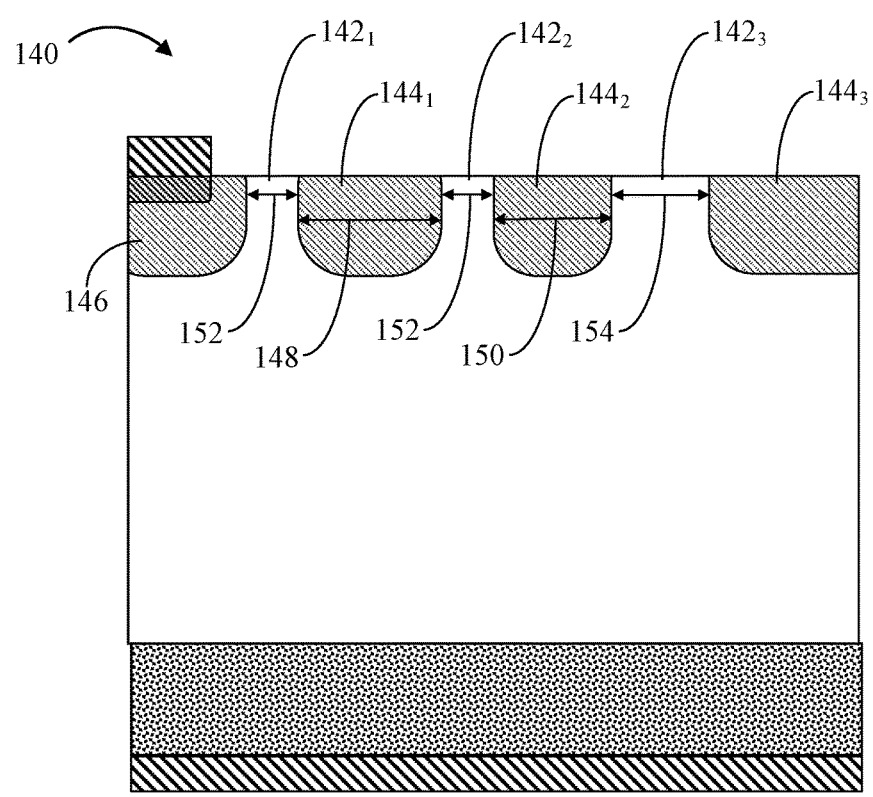
FIG. 8 shows a cross-sectional view of a trench power MOSFET in accordance with another embodiment.

FIG. 8 shows a cross-sectional view of a trench power MOSFET 140 in accordance with another embodiment. The location of cross-sectional view of MOSFET 140 corresponds to the location of cross-sectional view 6-6' shown in FIG. 6. Further, MOSFET 140 includes many of the elements of MOSFET 70 (FIGS. 5-6), such as a body area, termination area, epitaxial layer, drift region, drain region, parallel insulated trenches, conductive field plate, gate electrodes, and so forth. As such, a description of these elements will not be repeated herein for brevity.

In this example, MOSFET 140 includes spacer regions 142$_1$, 142$_2$, and 142$_3$ of a second conductivity type (e.g., n-type doping) extending laterally between pairs of the insulated trenches to produce floating body segments 144$_1$, 144$_2$, and 144$_3$ of a first conductivity type (e.g., p-type doping). Spacer region 142$_1$ is adjacent to a body region 146 of MOSFET 140. Floating body segment 144$_1$ resides between spacer regions 142$_1$ and 142$_2$. Further, floating body segment 144$_2$ resides between spacer regions 142$_2$ and 142$_3$. Still further, floating body segment 144$_3$ resides between spacer region 142$_3$ and an insulated termination trench loop (not shown).

A higher or lower voltage in the triple-point region can be acquired by modifying the configuration of the floating body segments. In this example illustration, floating body segment 144$_1$ exhibits a first segment width 148 parallel to the longitudinal dimension of the insulated trenches (see FIG. 5) and floating body segment 144$_2$ exhibits a second segment width 150 parallel to the longitudinal dimension of the insulated trenches that is different from first segment width 148. Further, spacer regions 142$_1$, 142$_2$ exhibits a first spacer width 152 parallel to the longitudinal dimension of the insulated trenches (again, see FIG. 5) and spacer region 142$_3$ exhibits a second spacer width 154 parallel to the longitudinal dimension of the insulated trenches that differs from first spacer width 152. In this generalized example, second spacer width 154 is greater than first spacer width 152. In general, if the floating body segments are farther apart, it may allow them to have a higher difference in potential, leading to the final segment (e.g., floating body segment 144$_3$) reaching an even higher voltage potential.

FIG. 8 is provided to demonstrate that the widths of the spacer regions and/or the widths of the floating body segments may be readily modified to attain a desired voltage at the triple-point regions since no additional mask is required to produce the desired doping patterns. Further, although three body segments are provided in the illustrated configuration, the design can be modified to include less than or more than the three body segments.

Figure 9:
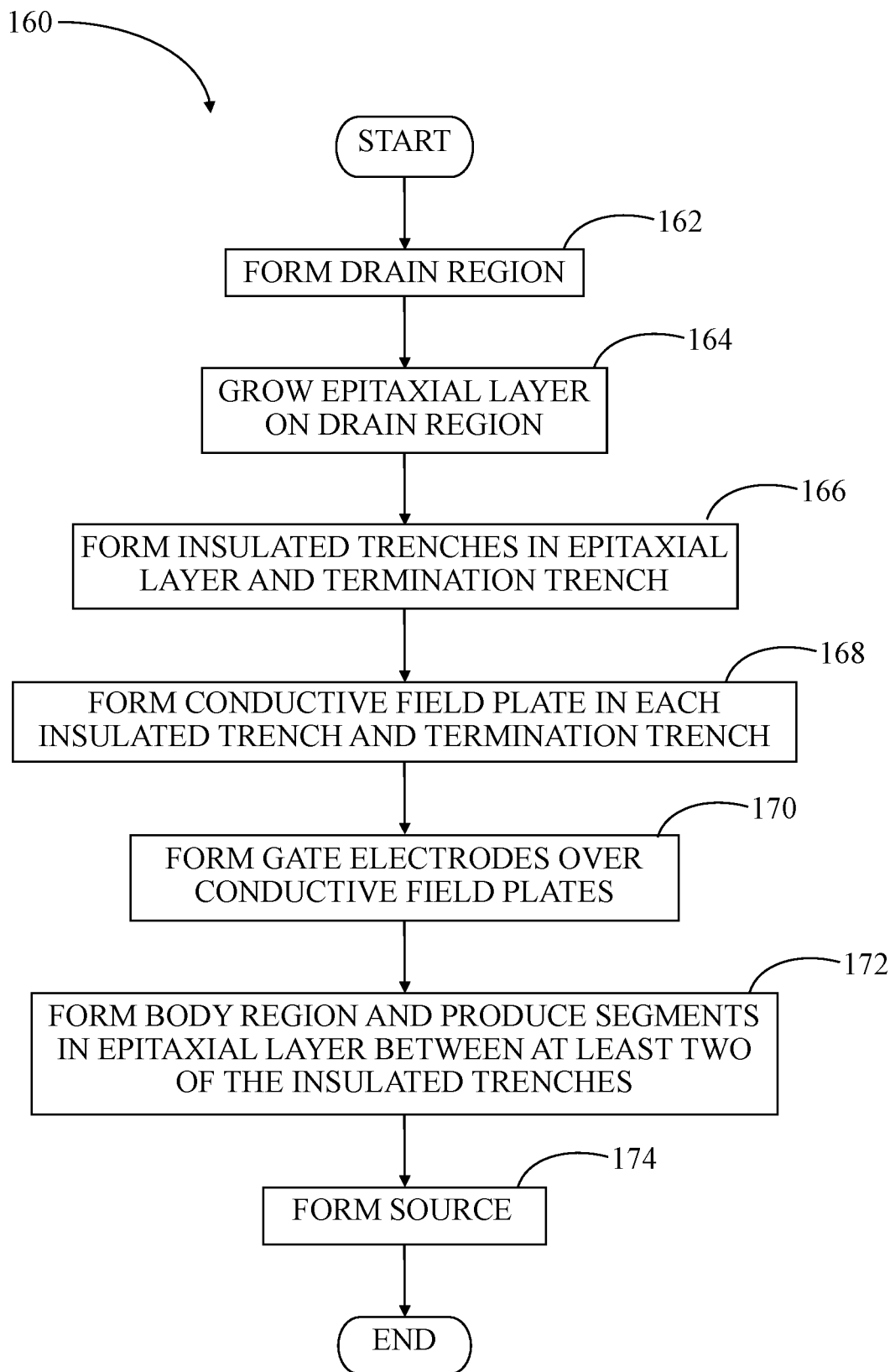
FIG. 9 shows a flowchart representation of a method for fabricating a semiconductor device in accordance with another embodiment.

FIG. 9 shows a flowchart representation of a method 160 for fabricating a semiconductor device in accordance with another embodiment. Fabrication method 160 may be performed to produce a semiconductor device having floating body segments that break up or otherwise isolate the active body area of the semiconductor device from the termination area of the semiconductor device, and are able to self-bias to an appropriate positive voltage. Accordingly, an electric field at a triple point region of the termination area can be effectively suppressed so that breakdown voltage roll-off at the termination area can be avoided.

At a block 162, a drain region (e.g., drain region 84, FIGS. 5-6) is formed with a doped semiconductor substrate. At a block 164, an epitaxial layer (e.g., epitaxial layer 82, FIGS. 5-6) is grown on the drain region such that an exterior surface of the epitaxial layer defines a first major surface (e.g., first major surface 74, FIGS. 5-6) of the semiconductor device and a second major surface (e.g., second major surface 7, FIGS. 5-6) opposes the first major surface.

At a block 166, insulated trenches (e.g., insulated trenches 86 and insulated trench loop 102, FIGS. 5-6) are formed in the epitaxial layer. The insulated trenches may be disposed in parallel with one another and extend from the first major surface toward the second major surface. At a block 168, a first polysilicon layer is formed in each of trenches 86, 102 to form a shield (e.g., conductive field plates 88,89, FIGS. 5-6) separated by the epitaxial layer by an insulator (e.g., insulators 100,101). At a block 170, a second polysilicon layer is formed in each of trenches 86 over the first polysilicon layer to form a gate electrode (e.g., gate electrodes 90, FIGS. 5-6) separated from the shield by a gate-field plate insulator (e.g., gate-field plate insulator 38, FIG. 2). The semiconductor device has an active area (e.g., active area 78, FIGS. 5-6) and a termination area (e.g., termination area 80, FIGS. 5-6) surrounding the active area. The gate electrode is absent in the termination area and the conductive field plate extends longitudinally in both of the active and termination areas.

At a block 172, a body region (e.g., body region 104, FIGS. 5-6) is formed and segments (e.g., floating body segments 114, FIGS. 5-6) are produced in the epitaxial layer between at least two of the insulated trenches at the termination area and between at least two spacer regions. The body region may be formed and the segments may be produced concurrently utilizing the same implantation process. The body region and segments are of a first conductivity type (e.g., p-type dopant) and the epitaxial layer and the spacer regions are of a second conductivity type (e.g., n-type dopant). A configuration may include any suitable number of segments isolated from the other segments and from the body region, and one or more segments may be formed between the spacer regions and the insulated termination trench (e.g., insulated trench loop 102, FIGS. 5-6). Further, the spacer regions and/or segments may be located outside of the outer perimeter of the active area and are thus in the termination area, may be located inside of the outer perimeter 98 and are thus in the active area 78 adjacent to gate electrodes 90, and/or may span across the outer perimeter of the active area. Still further, the spacer regions and/or segments may be any suitable width and may be different widths relative to one another.

At a block 174, a source contact (e.g., source contact 108, FIGS. 5-6) may be formed in a silicon mesa above the body region and between the insulated trenches. Of course, other continuing operations may include forming a drain contact (e.g., drain contact 110, FIG. 5-6), forming buildup layers above the first major surface, packaging, testing, and the like. Thereafter, method fabrication method 160 may end.

It should be understood that certain ones of the process blocks depicted in FIG. 9 may be performed in parallel with each other or with performing other processes. In addition, the particular ordering of the process blocks depicted in FIG. 9 may be modified while achieving substantially the same result. Accordingly, such modifications are intended to be included within the scope of the inventive subject matter.

Figure 10:
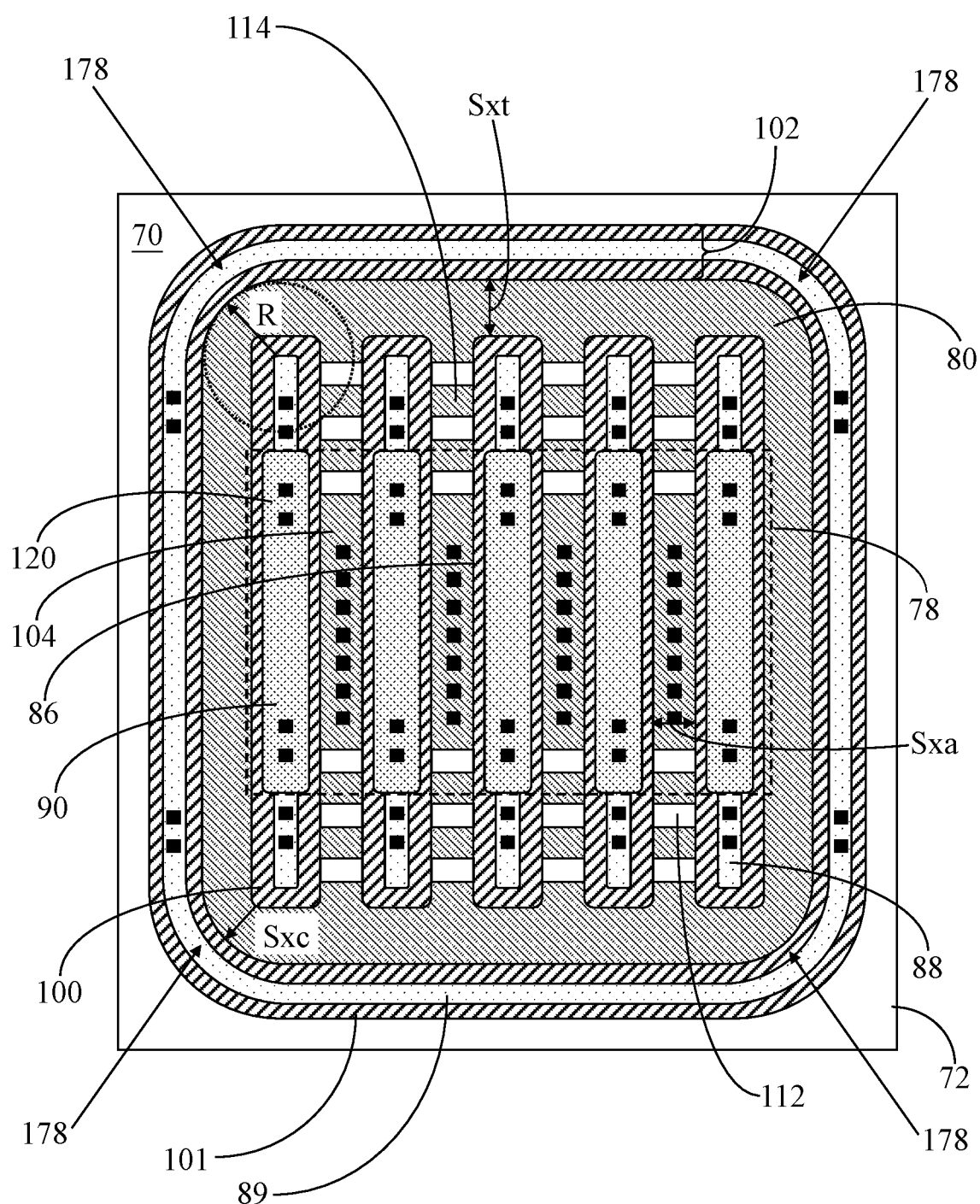
FIG. 10 shows another plan view of the trench power MOSFET of FIG. 5 to demonstrate issues that may arise at corner regions of the trench power MOSFET.

FIG. 10 shows another plan view of trench power MOSFET 70 to demonstrate issues that may arise at corner regions 178 of trench power MOSFET 70. The material of termination area 80 is the same as that for body region 78 (e.g., epitaxial layer 82, see FIG. 6). In the configuration of MOSFET 70, corner regions 178 have a relatively small radius of curvature, R. This relatively small radius of curvature, R, may cause the breakdown voltage to be lower at termination area 80 due to electric field crowding. An undesirably low breakdown voltage may occur in either a standard termination design (e.g., without floating body segments 114) or in a floating body segment design.

Figure 11:
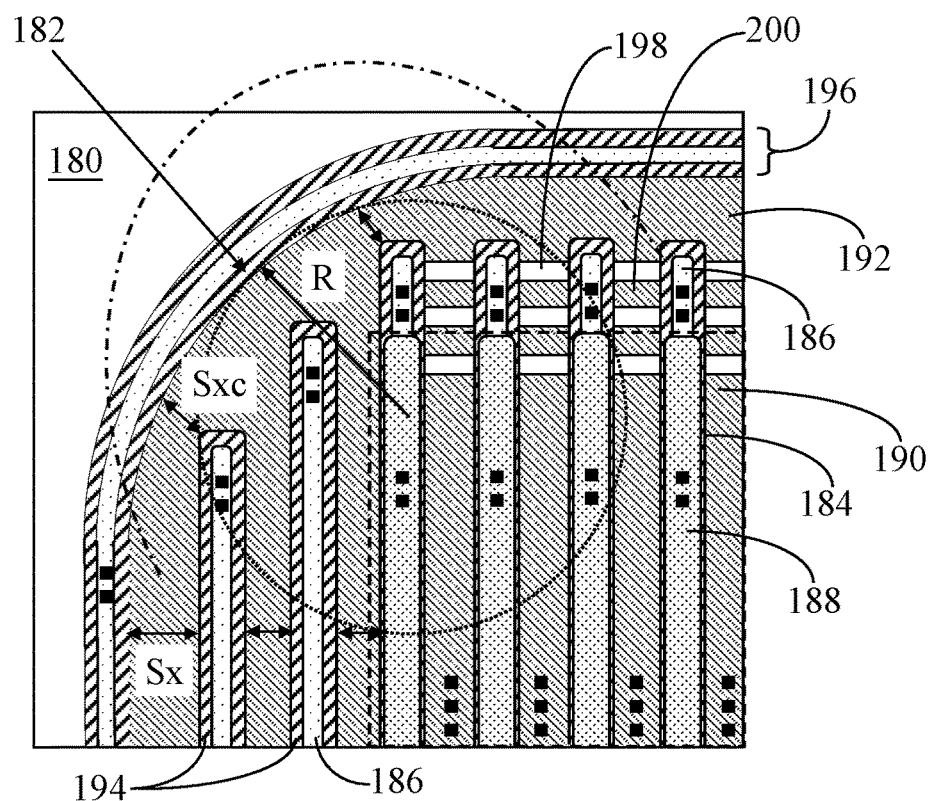
FIG. 11 shows a partial plan view of a trench power MOSFET at a corner region in accordance with another embodiment.
Figure 12:
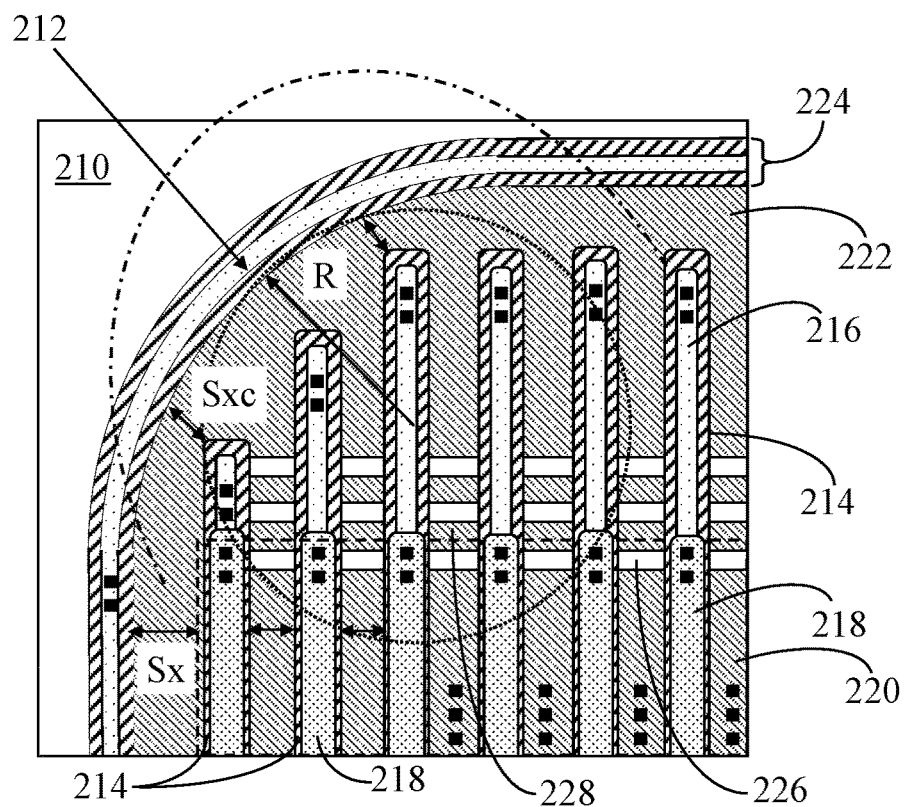
FIG. 12 shows a partial plan view of a trench power MOSFET at a corner region in accordance with another embodiment.
Figure 13:
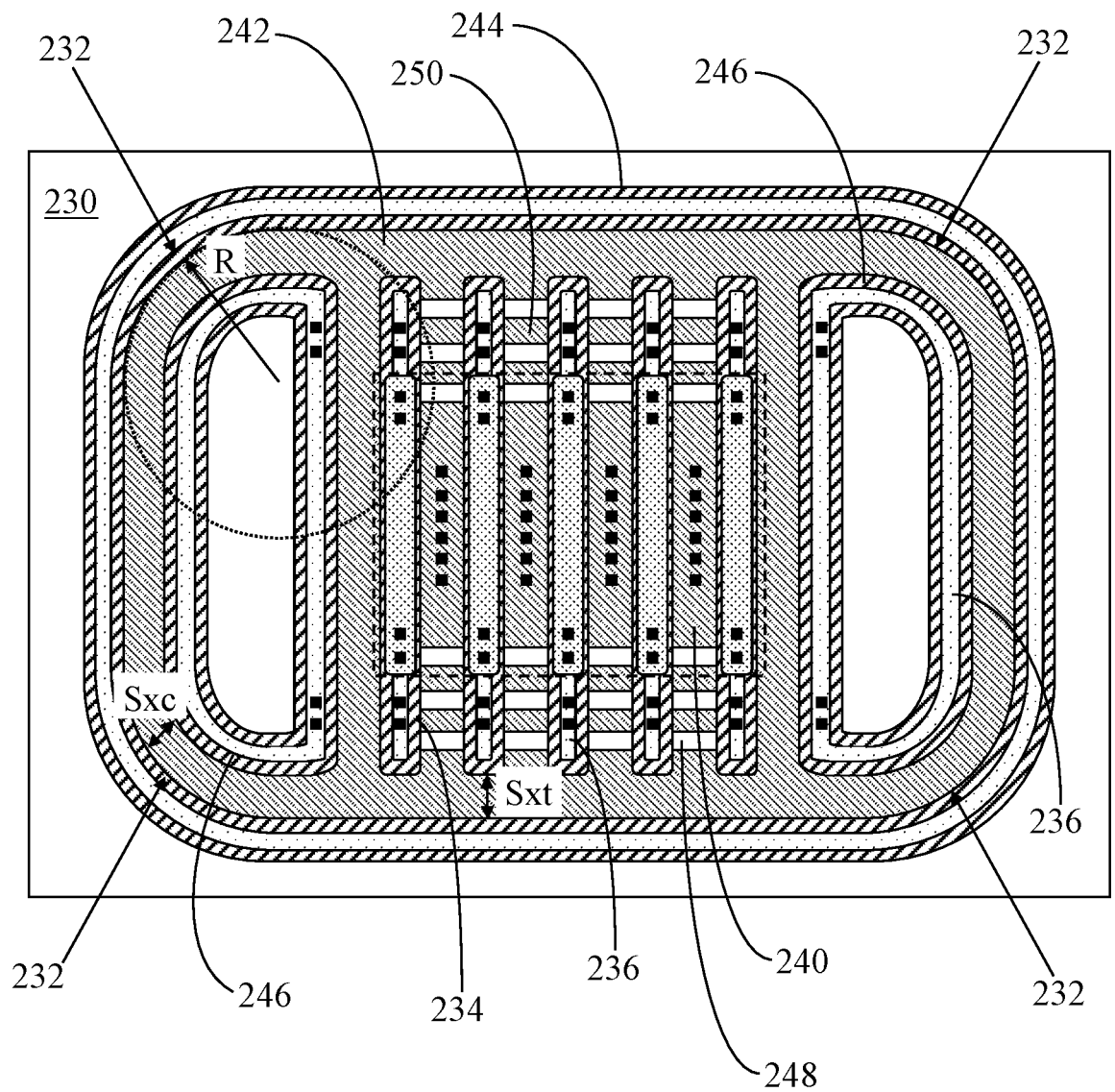
FIG. 13 shows a plan view of a trench power MOSFET in accordance with yet another embodiment.

An undesirably low breakdown voltage at corner regions 178 may be alleviated by increasing a width of Sxc (e.g., the distance between the edge of the closes one of trenches 86 and insulated trench loop 102 at corner regions 178) and/or by increasing the radius of curvature, R, at corner regions 178. The presence of floating body segments 114 can enable the feasibility of fabricating a wider Sxc in order to effectively increase the breakdown voltage at corner regions 178. However, if the wider Sxc does not sufficiently increase the breakdown voltage at corner regions 178, the radius of curvature, R, at corner regions 178 may need to be increased. FIGS. 11-13 demonstrate example embodiments for effectively increasing the radius of curvature, R, while maintaining the integrity of other regions. It should be understood, however, that other design configurations may be envisioned for increasing the radius of curvature, R, at corner regions 178.

FIG. 11 shows a partial plan view of a trench power MOSFET 180 at a corner region 182 in accordance with another embodiment. MOSFET 180 includes parallel insulated trenches 184, each of which includes a conductive field plate 186 (also referred to as a shield plate 186) and a gate electrode 188 overlying shield plate 186, with gate electrode 188 being separated from shield plate 186 by a gate-field insulator (not visible). An active area 190 of MOSFET 180 is defined by the outermost insulated trenches 184 and corresponding ends of trenches 184 and a termination area 192 surrounds active area 190. MOSFET 180 further includes insulated trenches 194 arranged parallel to trenches 184 and located outside of active area 190. Each of insulated trenches 194 includes shield plate 186. However, gate electrodes 188 are not included in insulated trenches 194. In a rectangular configuration, MOSFET 180 includes four corner regions 182 and insulated trenches 194 positioned on opposing sides of active area 190.

Insulated trenches 194 are offset or arranged in a stepped fashion at corner region 182 to enable a larger radius of curvature, R, to be achieved at corner region 182, relative to the radius of curvature of MOSFET 70 shown in FIG. 10. In this configuration, the body regions between the final few trenches 194 are connected to termination area 192, represented by a dash-dot-dash curve. Thus, the body regions between the active trenches 184 and a termination trench loop 196, between trenches 194, and between the endmost trench 194 and termination trench loop 196 will acquire the positive potential, thereby allowing them to have a wider spacing Sx (denoted by bidirectional arrows) between the trenches and a higher local breakdown voltage.

MOSFET 180 further includes spacer regions 198 and floating body segments 200, as discussed in detail in connection with spacer regions 112 and floating body segments 114 of MOSFET 70 (FIG. 5). The combination of floating body segments 200 as well as the effective increase in the radius of curvature, R, by the implementation of trenches 194 in termination area 192 may enable a higher local breakdown voltage at corner regions 182. However, increasing the radius of curvature, R, by the implementation of trenches 194 in the termination area of a standard termination layout (i.e., a layout without floating body segments 200) may also yield a sufficiently high local breakdown voltage at the corner regions.

FIG. 12 shows a partial plan view of a trench power MOSFET 210 at a corner region 212 in accordance with another embodiment. MOSFET 180 includes parallel insulated trenches 214, each of which includes a conductive field plate 216 (also referred to as a shield plate 216) and a gate electrode 218 overlying shield plate 216, with gate electrode 218 being separated from shield plate 216 by a gate-field insulator (not visible). An active area 220 of MOSFET 210 is defined by the outermost insulated trenches 214 and corresponding ends of trenches 214 and a termination area 222 surrounds active area 220. A termination trench loop 224 surrounds termination area 222. In a rectangular configuration, MOSFET 210 includes four corner regions 212.

Insulated trenches 214 are offset or arranged in a stepped fashion at corner region 212 to enable a larger radius of curvature, R, to be achieved at corner region 212, relative to the radius of curvature of MOSFET 70 shown in FIG. 10. MOSFET 210 further includes spacer regions 226 and floating body segments 228, as discussed in detail in connection with spacer regions 112 and floating body segments 114 of MOSFET 70 (FIG. 5). Floating body segments 228 are present between all of insulated trenches 214 including those that are offset or arranged in a stepped fashion. Again, due to a positive potential at corner regions 212 resulting from floating body segments 228, a wider spacing Sx (denoted by bidirectional arrows) may be achieved between trenches 214 and termination trench loop 224 and hence yield a higher local breakdown voltage.

FIG. 13 shows a plan view of a trench power MOSFET 230 having four corner regions 232 in accordance with yet another embodiment. MOSFET 230 includes parallel insulated trenches 234, each of which includes a conductive field plate 236 (also referred to as a shield plate 236) and a gate electrode 238 overlying shield plate 236, with gate electrode 238 being separated from shield plate 236 by a gate-field insulator (not visible). An active area 240 of MOSFET 232 is defined by the outermost insulated trenches 234 and corresponding ends of trenches 234 and a termination area 242 surrounds active area 240. A primary termination trench loop 244 surrounds termination area 242.

In this example embodiment, secondary termination loops 246 are arranged on opposing sides of the outermost insulated trenches 234 to enable a larger radius of curvature, R, at each of corner regions 232. Thus, in this example, there are no "triple-point" regions wherein the trenches curve. The Sxc at corner regions 232 can be larger or equal to Sxt, depending on a particular design requirement. Although size of active area 240 may be sacrificed by the additional secondary termination loops 246, the larger radius of curvature may yield a higher local breakdown voltage.

MOSFET 230 further includes spacer regions 248 and floating body segments 250 between insulated trenches 234, as discussed in detail in connection with spacer regions 112 and floating body segments 114 of MOSFET 70 (FIG. 5). The combination of floating body segments 250 as well as the effective increase in the radius of curvature, R, by the implementation of secondary termination loops 246 in termination area 242 may enable a higher local breakdown voltage at corner regions 232. However, increasing the radius of curvature, R, by the implementation of secondary termination loops 246 in the termination area of a standard termination layout (i.e., a layout without floating body segments 200) may also yield a sufficiently high local breakdown voltage at the corner regions.

Embodiments described herein entail a semiconductor device with improved breakdown voltage characteristics and methodology for fabricating such a semiconductor device. In particular, embodiments entail a trench field plate power Metal Oxide Semiconductor Field Effect Transistor (MOSFET) having a set of floating body segments formed between device trenches of the MOSFET. The floating body segments break up or otherwise isolate an active body area of the semiconductor device from a termination area of the semiconductor device. Further, the floating body segments are able to self-bias to an appropriate positive voltage. Accordingly, an electric field at a triple point region of the termination area can be effectively suppressed so that breakdown voltage roll-off at the termination area can be avoided. In some embodiments, the floating body segments may be formed using the same body implant/diffusion process as the active body area of the device. Such an approach can circumvent the need for additional masks/process steps to create the floating body segments and thereby achieve enhancements in fabrication efficiency and cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A semiconductor device comprising:
   a substrate having opposed first and second major surfaces, an active area, and a termination area;
   insulated trenches extending from the first major surface toward the second major surface, each of the insulated trenches including a conductive field plate and a gate electrode overlying the conductive field plate, the gate electrode being separated from the field plate by a gate-field plate insulator, wherein the conductive field plate extends longitudinally in both of the active area and the termination areas and the gate electrode is absent in the termination area;
   a body region having body segments of a first conductivity type at the first major surface that extend laterally between pairs of the insulated trenches and extend vertically toward the second major surface;
   a drift region having a second conductivity type disposed between the body region and the second major surface; and
   first and second spacer regions of the second conductivity type extending from the drift region and extending laterally between the pairs of the insulated trenches at the first major surface within the termination area to produce segments of the first conductivity type at the first major surface between the first and second spacer regions that are disjoint from the body segments of the body region;
wherein each body segment is contiguous in a central region of the active area between the insulated trenches that excludes the first and second spacer regions.

2. The semiconductor device of claim 1 wherein the segments of the first conductivity type are first segments, and the semiconductor device further comprises third spacer regions of the second conductivity type at the first major surface extending laterally between the pairs of the insulated trenches in the termination area, the third spacer regions being displaced from the second spacer regions to produce second segments of the first conductivity type at the first major surface between the second and third spacer regions that are disjoint from the first segments and from the body segments of the body region.

3. The semiconductor device of claim 2 wherein:
the first segments exhibit a first segment width parallel to a longitudinal dimension of the insulated trenches; and
the second segments exhibit a second segment width parallel to the longitudinal dimension of the insulation trenches, the second segment width differing from the first segment width.

4. The semiconductor device of claim 2 wherein the termination area surrounds the active area, and the semiconductor device further comprises an insulated termination trench surrounding the termination area, wherein a conductive shield plate resides in the insulated termination trench, and third segments of the first conductivity type are present between the third spacer regions and the insulated termination trench, the third segments being disjoint from the first and second segments and from the body segments of the body region.

5. The semiconductor device of claim 1 wherein:
the first spacer regions exhibit a first spacer width parallel to a longitudinal dimension of the insulated trenches; and
the second spacer regions exhibit a second spacer width parallel to the longitudinal dimension of the insulation trenches, the second spacer width differing from the first spacer width.

6. The semiconductor device of claim 1 wherein:
each of the insulated trenches comprises first and second end portions and a middle portion extending longitudinally between the first and second end portions, wherein the first and second spacer regions extend laterally between the first end portions of the pairs of the insulated trenches; and
the semiconductor device further comprises third and fourth spacer regions of the second conductivity type at the first major surface extending laterally between the second end portions of the pairs of the insulated trenches to produce additional segments of the first conductivity type at the first major surface between the third and fourth spacer regions that are disjoint from the body segments of the body region.

7. The semiconductor device of claim 1 wherein distal ends of the gate electrode in each of the insulated trenches define an outer perimeter of the active area, wherein at least one of the first and second spacer regions and the segments is adjacent to the gate electrode at the outer perimeter of the active area and separated from the gate electrode by an insulator.

8. The semiconductor device of claim 1 wherein at least one of the first and second spacer regions is adjacent to the field plate in the termination area and separated from the field plate by an insulator.

9. The semiconductor device of claim 1 wherein the body segments of the body region and the segments of the first conductivity type are configured to be formed concurrently in the same implantation process.

10. The semiconductor device of claim 1 further comprising:
source regions above the body region at the first major surface between the insulated trenches; and
a drain region of the second conductivity type under the drift region, such that the source, body, drift, and drain regions extend in that order from the first major surface toward the second major surface, wherein the gate electrode is adjacent to the body region in the active area and is separated from the body region by an insulator, and the field plate is adjacent to the drift region and is separated from the drift region by the insulator.

11. The semiconductor device of claim 1, wherein the termination area includes a contiguous region at the top surface having the first conductivity type that encircles the active area and is disjoint from the body segments of the body region.

12. A semiconductor device comprising:
a substrate having opposed first and second major surfaces, an active area, and a termination area surrounding the active area;
insulated trenches extending from the first major surface toward the second major surface, each of the insulated trenches comprising first and second end portions and a middle portion extending longitudinally between the first and second end portions, each of the insulated trenches including a conductive field plate and a gate electrode overlying the conductive field plate, the gate electrode being separated from the conductive field plate by a gate-field plate insulator, wherein the conductive field plate extends longitudinally in both of the active and termination areas and the gate electrode is absent in the termination area;
a body region having body segments of a first conductivity type at the first major surface that extend laterally between corresponding pairs of the insulated trenches and extend vertically toward the second major surface;
a drift region having a second conductivity type disposed between the body region and the second major surface;
first and second spacer regions of the second conductivity type extending from the drift region at the first major surface and extending laterally between the pairs of the insulated trenches at the first end portion to produce first segments of the first conductivity type at the first major surface between the first and second spacer regions that are disjoint from the body segments of the body region; and
third and fourth spacer regions of the second conductivity type extending from the drift region at the first major surface extending laterally between the pairs of the insulated trenches at the second end portions to produce additional segments of the first conductivity type at the first major surface between the third and fourth spacer regions that are disjoint from the body segments of the body region, wherein the body segments, the first segments, and the additional segments are configured to be formed concurrently in the same implantation process;

wherein each body segment is contiguous in a central region of the active area between the pairs of insulated trenches that excludes the first, second, third, and fourth spacer regions.

13. The semiconductor device of claim 12 wherein:

distal ends of the gate electrode in each of the insulated trenches define an outer perimeter of the active area;

at least one of the first and second spacer regions and the first segments is adjacent to the gate electrode at the outer perimeter of the active area at the first end portions and is separated from the gate electrode by an insulator; and at least one of the third and fourth spacer regions and the additional segments is adjacent to the gate electrode at the outer perimeter of the active area at the second end portions and is separated from the gate electrode by an insulator.

14. The semiconductor device of claim 13 further comprising:

fifth spacer regions of the second conductivity type at the first major surface extending laterally between the pairs of the insulated trenches at the first end portion of the termination area, the fifth spacer regions being displaced from the second spacer regions to produce third segments of the first conductivity type at the first major surface between the second and fifth spacer regions that are disjoint from the body segments of the body region, wherein at least one of the fifth spacer regions and the third segments is adjacent to the field plate in the and is separated from the field plate by an insulator; and sixth spacer regions of the second conductivity type at the first major surface that extend from the drift region and extend laterally between the pairs of the insulated trenches at the second end portion of the termination area, the sixth spacer regions being displaced from the fourth spacer regions to produce fourth segments of the first conductivity type at the first major surface between the fourth and sixth spacer regions that are disjoint from the body region, wherein at least one of the sixth spacer regions and the fourth segments is adjacent to the field plate in the termination area and is separated from the field plate by an insulator.

15. The semiconductor device of claim 12, wherein the termination area includes a contiguous region at the top surface having the first conductivity type that encircles the active area and is disjoint from the body segments of the body region.

16. A transistor device comprising:

a semiconductor substrate having a first major surface (a "top surface") and a second major surface (a "bottom surface");

a first insulated trench formed within the semiconductor substrate, wherein:

the first insulated trench extends in a vertical direction from the top surface toward the bottom surface and has a depth less than a distance from the top surface to the bottom surface;

the first insulated trench extends in a first lateral direction from a first end to a second end of the first insulated trench;

the first insulated trench has a width defined along a second lateral direction perpendicular to the first lateral direction and the vertical direction;

a first conductive field plate is disposed within the first insulated trench and extends along the first lateral direction from the first end of the first end to the second end of the first insulated trench; and the first insulated trench includes a first end portion near the first end of the first insulated trench, a second end portion near the second end of the first insulated trench, and a middle portion between the first end and the second end of the first insulated trench that excludes the first end portion and the second end portion of the first insulated trench;

a second insulated trench formed within the semiconductor substrate, wherein:

the second insulated trench extends in the vertical direction from the top surface toward the bottom surface and has a depth less than the distance from the top surface to the bottom surface;

the second insulated trench extends in the first lateral direction from a first end to a second end of the second insulated trench;

the second insulated trench has a width defined along the second lateral direction;

a second conductive field plate is disposed within the second insulated trench and extends along the first lateral direction from the first end to the second end of the second insulated trench; and the second insulated trench includes a first end portion near the first end of the second insulated trench, a second end portion near the second end of the second insulated trench, and a middle portion between the first end and the second end of the second insulated trench that excludes the first end portion and the second end portion of the second insulated trench;

an active area that includes the middle portion of the first insulated trench and the middle portion of the second insulated trench, the active area further including:

a contiguous first body region of a first conductivity type at the first major surface within the semiconductor substrate disposed between the middle portions of the first and second insulated trenches, the first body region extending in the vertical direction from the top surface of the semiconductor substrate toward the bottom surface of the semiconductor substrate and having a depth of the first body region along the vertical direction;

a first source well within the first body region having a second conductivity type opposite the first conductivity type disposed at the top surface that extends into the first body region along the vertical direction and having a depth less than the depth of the first body region;

a first gate electrode overlying the first field plate above the middle portion of the first insulated trench, the first gate electrode being separated from the first field plate by a gate-field plate insulator material; and a second gate electrode overlying the second field plate above the middle portion of the second insulated trench, the second gate electrode being separated from the second field plate by the gate-field plate insulator material;

a drift region having the second conductivity type within the semiconductor substrate disposed below the active area;

a termination area surrounding the active area, wherein:

gate electrodes are absent above the first and second insulated trenches in the termination area; and the termination area includes a contiguous region at the top surface having the first conductivity type; and at least first and second spacer regions that extend from the drift region at the top surface having the second conductivity type, wherein:

the first spacer region is adjacent to a first end of the first body region nearest the first ends of the first and second insulated trenches and the first spacer region extends along the vertical direction from the top surface toward the bottom surface;

the second spacer region is adjacent to a second end of the first body region nearest the second ends of the first and second insulated trenches and the second spacer region extends along the vertical direction from the top surface toward the bottom surface; and the first and second spacer regions are configured to electrically isolate the first body region from the contiguous region of the termination area when the transistor device is in an on state in which the transistor device is configured to provide an electrically conductive path between the first source well and the drift region.

17. The transistor device of claim 16, further comprising at least third and fourth spacer regions that extend from the drift region at the top surface, wherein:

the third spacer region extends along the vertical direction from the top surface toward the bottom surface and is disposed between the first spacer region and the contiguous region of the termination area; and the fourth spacer region extends along the vertical direction from the top surface toward the bottom surface and is disposed between the second spacer region and the contiguous region of the termination area.

18. The transistor device of claim 17, further comprising:

at least a third insulated trench formed within the semiconductor substrate, wherein:

the third insulated trench extends in the vertical direction from the top surface toward the bottom surface and has a depth less than the distance from the top surface to the bottom surface;

the third insulated trench extends in the first lateral direction from a first end to a second end of the second insulated trench;

the third insulated trench has a width defined along the second lateral direction;

a third conductive field plate is disposed within the third insulated trench and extends along the first lateral direction from the first end to the second end of the third insulated trench;

the third insulated trench includes a first end portion near the first end of the third insulated trench, a second end portion near the second end of the second insulated trench, and a middle portion between the first end and the second end of the third insulated trench that excludes the first end portion and the second end portion of the third insulated trench; and the middle portion of the third insulated trench is disposed within the active area;

wherein the active area further includes:

a second body region of the first conductivity type within the semiconductor substrate disposed between the middle portions of the second and third insulated trenches, the second body region extending in the vertical direction from the top surface of the semiconductor substrate toward the bottom surface of the semiconductor;

a second source well within the second body region having the second conductivity type disposed at the top surface that extends into the second body region along the vertical direction and having a depth less than the depth of the second body region; and a third gate electrode overlying the third field plate above the middle portion of the third insulated trench, the third gate electrode being separated from the third field plate by a gate-field plate insulator material;

wherein the second body region is separated from the termination area by at least fifth and sixth spacer regions that extend from the drift region;

wherein the fifth spacer region is adjacent to a first end of the second body region nearest the first ends of the second and third insulated trenches and the fifth spacer region extends along the vertical direction from the top surface toward the bottom surface;

wherein the sixth spacer region is adjacent to a second end of the second body region nearest the second ends of the second and third insulated trenches and the sixth spacer region extends along the vertical direction from the top surface toward the bottom surface; and wherein the fifth and sixth spacer regions are jointly configured and arranged to electrically isolate the second body region from the contiguous region of the termination area when the transistor is in the on state in which the transistor is configured to provide an electrically conductive path between the second source well and the drift region.

* * * * *